United States Patent
Chang et al.

(10) Patent No.: US 11,479,858 B2
(45) Date of Patent: *Oct. 25, 2022

(54) THIO(DI)SILANES

(71) Applicant: DOW SILICONES CORPORATION, Midland, MI (US)

(72) Inventors: Noel Mower Chang, Midland, MI (US); Byung K. Hwang, Midland, MI (US); Brian David Rekken, Midland, MI (US); Vasgen Aram Shamamian, Midland, MI (US); Xianghuai Wang, Midland, MI (US); Xiaobing Zhou, Midland, MI (US)

(73) Assignee: DOW SILICONES CORPORATION, Midland, MI (US)

( * ) Notice: Subject to any disclaimer, the term of this patent is extended or adjusted under 35 U.S.C. 154(b) by 177 days.

This patent is subject to a terminal disclaimer.

(21) Appl. No.: 16/338,166

(22) PCT Filed: Oct. 10, 2017

(86) PCT No.: PCT/US2017/055874
§ 371 (c)(1),
(2) Date: Mar. 29, 2019

(87) PCT Pub. No.: WO2018/071379
PCT Pub. Date: Apr. 19, 2018

(65) Prior Publication Data
US 2020/0024291 A1 Jan. 23, 2020

Related U.S. Application Data

(60) Provisional application No. 62/407,008, filed on Oct. 12, 2016.

(51) Int. Cl.
| | | |
|---|---|---|
| *C07F 7/02* | (2006.01) | |
| *C23C 16/455* | (2006.01) | |
| *C23C 16/30* | (2006.01) | |
| *C23C 16/34* | (2006.01) | |
| *C23C 16/40* | (2006.01) | |
| *C23C 16/56* | (2006.01) | |

(52) U.S. Cl.
CPC ........ *C23C 16/45553* (2013.01); *C07F 7/025* (2013.01); *C23C 16/305* (2013.01); *C23C 16/345* (2013.01); *C23C 16/401* (2013.01); *C23C 16/56* (2013.01)

(58) Field of Classification Search
CPC ............ C23C 16/45553; C23C 16/305; C23C 16/345; C23C 16/401; C23C 16/56; C07F 7/025
See application file for complete search history.

(56) References Cited

U.S. PATENT DOCUMENTS

| | | | |
|---|---|---|---|
| 9,382,268 B1 * | 7/2016 | Kuchenbeiser | ....... C23C 16/401 |
| 2009/0126604 A1 | 5/2009 | Akhtar et al. | |
| 2017/0298510 A1 * | 10/2017 | Husson | ................ C23C 16/402 |
| 2020/0024737 A1 * | 1/2020 | Chang | .................. C07F 7/0898 |

FOREIGN PATENT DOCUMENTS

| | | | |
|---|---|---|---|
| CN | 103801394 A | 5/2014 | |
| EP | 071487 A1 | 9/1995 | |
| EP | 0671487 A1 * | 9/1995 | .............. C25B 3/29 |
| GB | 1418609 A | 12/1975 | |
| JP | S5037731 A | 4/1975 | |
| JP | S62252304 A | 11/1987 | |
| KR | 1020150034123 A | 4/2015 | |
| WO | 2007118474 A2 | 10/2007 | |
| WO | 2014015232 A1 | 1/2014 | |

OTHER PUBLICATIONS

CAS Abstract and Indexed Compounds M. Schmeisser et al., 8 Zeitschrift fuer Chemie, 254-255 (1968) (Year: 1968).*
F. Ulig et al., 90 Phosphorus, Sulfur and Silicon and the Related Elements, 29-39 (1994) (Year: 1994).*
CAS Abstract and Indexed Compounds, J. Thompson et al., 57 Canadian Journal of Chemistry, 994-998 (1979) (Year: 1979).*
CAS Abstract and Indexed Compound, F. Ulig et al., 90 Phosphorus, Sulfur and Silicon and the Related Elements, 29-39 (1994) (Year: 1994).*
J. Thompson et al., 57 Canadian Journal of Chemistry, 994-998 (1979) (Year: 1979).*
J. Anderson et al., 7 Inorganic and Nuclear Chemistry Letters, 1007-1010 (1971) (Year: 1971).*
CAS Abstract and Indexed Compound, J. Anderson et al., 7 Inorganic and Nuclear Chemistry Letters, 1007-1010 (1971) (Year: 1971).*
CAS Abstract RN 70899-50-2 (Nov. 16, 1984) (Year: 1984).*
CAS Abstract RN 353800-80-3 (Aug. 30, 2001) (Year: 2001).*
CAS Abstract RN 463312-95-0 (Oct. 21, 2002) (Year: 2002).*
CAS Abstract RN 876109-57-8 (Mar. 8, 2006) (Year: 2006).*
Schmeisser, M. et al., "ClNO3 als Ausgangsmaterial fur Acylnitrate, Uber Aclnitrate und Acylperchlorate (IV.)1)", Angewandte Chemie, 1957, 69, p. 781-782.
Machine assisted English translation of JPS62252304A obtained from https://worldwide.espacenet.com on Nov. 23, 2020, 5 pages.
International Search Report for International Application No. PCT/US2017/055874 dated Jan. 31, 2018, 4 pages.
Machine assisted translation of WO2007118474A2 obtained from https://worldwide.espacenet.com on Mar. 27, 2019, 47 pages.
Thompson, James Charlton et al., "Reactions of silicon fluorides with some non-metal hydrides", Canadian Journal of Chemistry, vol. 57, No. 9, 1979, pp. 994-998.

(Continued)

*Primary Examiner* — Alexander R Pagano
(74) *Attorney, Agent, or Firm* — Warner Norcross + Judd LLP

(57) ABSTRACT

Thio(di)silanes comprising a thiosilane of formula (A): $(R^{1a}R^{1b}R^{1c}CS)_s(Si)X_xH_h$ (A) wherein subscript s is from 2 to 4 or a thiodisilane of formula (I): $(R^{1a}R^{1b}R^{1c}CS)_s(R^2{}_2N)(Si-Si)X_xH_h$ (I) wherein subscript s is from 1 to 6, and wherein $R^{1a}$, $R^{1b}$, $R^{1c}$, $R^2$, X and subscripts n, x and h are defined herein. Also compositions comprising same, methods of making and using same, intermediates useful in synthesis of same, films and materials prepared therefrom.

6 Claims, No Drawings

(56) References Cited

OTHER PUBLICATIONS

Chihi, Abdelkrim et al., "Insertion reactions of dimethylsilylene into silicon-sulfur and sulfur-sulfur single bonds", Journal of Organometallic Chemistry, vol. 210, No. 2, May 5, 1981, pp. 163-168.
Backer, H. J. et al. "Esters of tetrathio orthosilicic acid. II", Database CA Chemical Abstracts Service, Columbus, Ohio, US.
Dey, Rupa R. et al., "Novel protocol for the synthesis of organic ammonium tribromides and investigation of 1,1'-(ethane-1,2-diyl)dipiperidiniumbis(tribromide) in the silylation of alcohols and thiols", Chemistry Letters, vol. 43, No. 10, Jul. 1, 2014, pp. 1545-1547.
Journal of physical and chemical reference data, 1977, 6(3), pp. 919-991.
Machine assisted English translation of CN103801394A obtained from https://patents.google.com/patent on May 5, 2020, 9 pages.
Grumbine, Steven K. et al., "Synthesis and Study of Ruthenium Silylene Complexes of the Type [(n5-C5Me5)(Me3P) 2Ru=SiX2]+ (X=Thiolate, Me, and PH)", Organometallics 1998,17, 5607-5619.
Uhlig, F. et al., Phosphorus, Sulfur, and Silicon, 1994, vol. 90, pp. 29-39.
Muller, Dr. Richard, Zeitschrift fuer Chemie, 1968, 8(7), pp. 254-255.
Wolinski, Leon et al., "Studies in Silico-Organic Compounds: XVII. The Action of Bromine on Alkyl Thioethers of Silicon", Journal of Organic Chemistry, 1951, 16, pp. 1138-1142.
International Search Report for International Application No. PCT/US2017/055857 dated Feb. 15, 2018, 5 pages.

\* cited by examiner

THIO(DI)SILANES

CROSS-REFERENCE TO RELATED APPLICATIONS

This application is the National Stage of International Application No. PCT/US2017/055874 filed on 10 Oct. 2017, which claims priority to and all advantages of U.S. Provisional Appl. No. 62/407,008 filed on 12 Oct. 2016, the contents of which is hereby incorporated by reference.

This invention generally relates to thio(di)silane compounds, compositions comprising same, methods of making and using same, intermediates useful in synthesis of same, films and materials prepared therefrom, and methods of making the films and materials.

Elemental silicon and silicon compounds with one or more of oxygen, carbon, or nitrogen have a variety of uses. For example, a film composed of elemental silicon, silicon oxide, silicon carbide, silicon nitride, silicon carbonitride, or silicon oxycarbonitride may be used as a semiconductor, an insulating layer or a sacrificial layer in the manufacture of electronic circuitry for electronic or photovoltaic devices.

Known methods of preparing the silicon material may use one or more silicon-yielding precursor materials using processes such as chemical vapor deposition or atomic layer deposition processes. These precursors are not limited to making silicon for electronic or photovoltaic applications.

Despite decades of research, however, most designers of silicon-yielding precursors have avoided sulfur-containing moieties. We believe this is due in part to their perception that sulfur-containing silicon compounds are unsuitable as precursors due to difficulties with synthesizing sulfur-containing silicon compounds and due to molecular instability of conventional sulfur-containing silicon compounds. We see a long-felt unmet need in the electronics and photovoltaic industries for improved silicon-yielding precursors. If the problems with sulfur could be overcome, we think sulfur-containing silicon-yielding precursors having one or more sulfur atoms per molecule would enable making new silicon films and silicon sulfide materials. New sulfur-containing silicon-yielding precursors might also enable lowering of deposition temperatures and making finer semiconductor features for better performing electronic and photovoltaic devices. We sought new and improved sulfur-containing silicon compounds and a new synthesis thereof. Ideally the sulfur-containing silicon compounds would be molecularly stable in neat form (purity ≥95% to 100%) at storage and transportation temperatures (e.g., 20° to 30° C.).

BRIEF SUMMARY OF THE INVENTION

We have discovered and synthesized thio(di)silane compounds, compositions comprising same, methods of making and using same, intermediates useful in synthesis of same, films and materials prepared therefrom, and methods of making the films and materials. The inventive thio(di)silane compounds include thiosilane compounds having one silicon atom and two or more sulfur atoms per molecule and thiodisilane compounds having two silicon atoms and one or more sulfur atoms per molecule. Unlike prior sulfur-containing silane compounds, the inventive thio(di)silane compounds are molecularly stable at ambient temperature, where decomposition thereof is inhibited or prevented. Thus, neat forms (purity ≥95% to 100%) of the thio(di)silanes may be stored and transported. The molecular stability of the thio(di)silane compounds is due to their improved structures. The design principles used to configure the structures of the inventive thiosilane compounds are the same as the design principles used to configure the structures of the inventive thiodisilane compounds, although due to structural differences between silanes (one Si, also called monosilanes) and disilanes (Si—Si), the results are somewhat different. The inventive thio(di)silane compounds are useful as silicon-yielding precursors and may be used as such in chemical vapor deposition and atomic layer deposition processes.

The inventive thio(di)silanes are useful in making silicon-containing films and materials such as bulk silicon disulfide. The silicon-containing films are useful in (opto)electronic and photovoltaic devices. The invention method may have additional uses unrelated to these applications.

DETAILED DESCRIPTION OF THE INVENTION

The Brief Summary and Abstract are incorporated here by reference. Some embodiments of the invention include the following numbered aspects.

Aspect 1. A thiodisilane of formula (I):

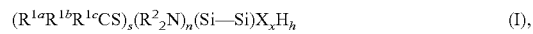

$$(R^{1a}R^{1b}R^{1c}CS)_s(R^2_2N)_n(Si-Si)X_xH_h \quad (I),$$

wherein: subscripts is an integer from 1 to 6; subscript n is an integer from 0 to 5; subscript x is an integer from 0 to 5; subscript h is an integer from 0 to 5; with the proviso that sum s+n+x+h=6; each H, when present in formula (I) (i.e., when subscript h is 1 to 5), is independently bonded to the same or different one of the silicon atoms in formula (I); each X is a monovalent halogen atom F, Cl, or Br and, when present in formula (I) (i.e., when subscript x is 1 to 5), is independently bonded to the same or different one of the silicon atoms in formula (I); wherein $R^{1a}$, $R^{1b}$, and $R^{1c}$ are defined by limitation (a), (b), or (c): (a) at least one $R^{1a}$ independently is $(C_2-C_{20})$alkyl or phenyl and each of any remaining $R^{1a}$, $R^{1b}$, and $R^{1c}$ independently is H or $(C_1-C_{20})$hydrocarbyl; or (b) there is at least one group $R^{1a}R^{1b}R^{1c}C$ that independently is a substituted $(C_6-C_{20})$aryl and each of any remaining $R^{1a}$, $R^{1b}$, and $R^{1c}$ independently is H or $(C_1-C_{20})$hydrocarbyl; or (c) any two of $R^{1a}$, $R^{1b}$, and $R^{1c}$ (collectively $R^1$ groups), in the same or different $R^{1a}R^{1b}R^{1c}C$ group, are bonded together to form a divalent group, —$R^{11}$—, wherein —$R^{11}$— is a $CH_2$ or a $(C_3-C_{20})$hydrocarbylene and each of any remaining $R^{1a}$, $R^{1b}$, and $R^{1c}$ independently is H or $(C_1-C_{20})$hydrocarbyl; each $R^2$ group independently is H or a $(C_1-C_{20})$hydrocarbyl; or any two $R^2$ groups may be bonded together to form a divalent group, —$R^{22}$—, wherein —$R^{22}$— is a $(C_2-C_{20})$hydrocarbylene and each of any remaining $R^2$ groups independently is H or a $(C_1-C_{20})$hydrocarbyl; each hydrocarbyl and hydrocarbylene independently is unsubstituted or substituted with from 1 to 5 substituents SUB; and each SUB independently is unsubstituted $(C_1-C_6)$alkyl, unsubstituted $(C_3-C_6)$cycloalkyl, unsubstituted $(C_2-C_6)$alkenyl, unsubstituted $(C_2-C_6)$alkynyl, unsubstituted $(C_6-C_7)$aryl, fluoro, chloro, iodo, or bromo. Alternatively, s is 1 to 5, alternatively s is 1 to 4, alternatively s is 1 to 3, alternatively s is 1 or 2, alternatively s is 2 to 6, alternatively s is 2 to 5, alternatively s is 2 to 4, alternatively s is 2 or 3, alternatively s is 1; alternatively s is 2, alternatively s is 3, alternatively s is 4, alternatively s is 5, alternatively s is 6. Each $R^{1a}R^{1b}R^{1c}CS$ group is independently bonded at its sulfur atom to the same or different one of the silicon atoms in formula (I). In some embodiments at least one, alternatively each $R^{1a}R^{1b}R^{1c}CS$ group is a monovalent group (having a radical at S). Alternatively, at least one, alternatively each $R^{1a}R^{1b}R^{1c}CS$ group is a divalent group (having a first radical at S and a second radical at either C or $R^{1a}$). The group $R^{1a}R^{1b}R^{1c}C$ that independently is a substituted $(C_6-C_{20})$aryl means $R^{1a}R^{1b}$, and $R^{1c}$ taken together with the carbon atom C form a substituted $(C_6-C_{20})$aryl. Each $R^2{}_2N$ group, when present in formula (I) (i.e., when subscript n is 1 to 5), is independently bonded at its nitrogen atom to the same or different one of the silicon atoms in formula (I). In some embodiments at least one, alternatively each $R^2{}_2N$ group is a monovalent group (having a radical at N). Alternatively, at least one, alternatively each $R^2{}_2N$ group is a divalent group (having a first radical at N and a second radical at either N or at $R^2$). In some embodiments, any aspect of the thiodisilane of formula (I) may be characterized as being in neat form, having a purity from ≥95% to 100%. The neat form of any such aspect of the thiodisilane of formula (I) may be molecularly stable at ambient storage and transportation temperatures (e.g., 20° to 30° C.).

Aspect 2. The thiodisilane of aspect 1 wherein: subscript s is an integer from 1 to 4; subscript n is an integer from 0 to 2; subscript x is an integer from 0 to 2; subscript h is an integer from 0 to 2; with the proviso that sum s+n+x+h=6; and wherein X, $R^{1a}$, $R^{1b}$, $R^{1c}$, and $R^2$ are as defined above for formula (I). Alternatively, s is 1 to 3, alternatively s is 1 or 2, alternatively s is 1; alternatively s is 2, alternatively s is 3, alternatively s is 4.

Aspect 3. The thiodisilane of aspect 1 wherein subscript s is an integer from 1 to 4; each of subscripts n and x is 0; subscript h is 2 to 5; with the proviso that sum s+h=6; and wherein $R^{1a}$, $R^{1b}$, and $R^{1c}$ are as defined above for formula (I). Alternatively, s is 1 to 3, alternatively s is 1 or 2, alternatively s is 1; alternatively s is 2, alternatively s is 3, alternatively s is 4.

Aspect 4. The thiodisilane of aspect 1, wherein subscript s is an integer from 1 to 4; each of subscripts n and h independently is from 1 to 5; subscript x is 0; with the proviso that sum s+n+h=6; and wherein $R^{1a}$, $R^{1b}$, $R^{1c}$, and $R^2$ are as defined above for formula (I). Alternatively, s is 1 to 3, alternatively s is 1 or 2, alternatively s is 1; alternatively s is 2, alternatively s is 3, alternatively s is 4.

Aspect 5. The thiodisilane of aspect 1 wherein subscript s is an integer from 1 to 4; each of subscripts n and h is 0; subscript x is 2 to 5; with the proviso that sum s+x=6; and wherein X, $R^{1a}$, $R^{1b}$, and $R^{1c}$ are as defined above for formula (I). Alternatively, s is 1 to 3, alternatively s is 1 or 2, alternatively s is 1; alternatively s is 2, alternatively s is 3, alternatively s is 4.

Aspect 6. The thiodisilane of aspect 1, wherein subscript s is an integer from 1 to 4; each of subscripts x and h independently is from 1 to 5; subscript n is 0; with the proviso that sum s+x+h=6; and wherein X, $R^{1a}$, $R^{1b}$, and $R^{1c}$ are as defined above for formula (I). Alternatively, s is 1 to 3, alternatively s is 1 or 2, alternatively s is 1; alternatively s is 2, alternatively s is 3, alternatively s is 4.

Aspect 7. The thiodisilane of any one of aspects 1-6 wherein subscript s is 1 or 2.

Aspect 8. The thiodisilane of any preceding aspect wherein each X is F, Cl, I, or Br;
and each $(C_1-C_{20})$hydrocarbyl independently is $(C_1-C_{20})$ alkyl, $(C_2-C_{20})$alkenyl, $(C_2-C_{20})$alkynyl, $(C_3-C_{20})$cycloalkyl, or $(C_6-C_{20})$aryl; or any two $(C_1-C_{20})$hydrocarbyl groups may be bonded together to form a divalent group that is a $(C_1-C_{20})$alkylene, $(C_2-C_{20})$alkenylene, $(C_2-C_{20})$alkynylene, or $(C_6-C_{20})$arylene.

Aspect 9. The thiodisilane of any preceding aspect wherein each X is Cl and each $(C_1-C_{20})$hydrocarbyl independently is a $(C_1-C_{12})$hydrocarbyl, a $(C_1-C_8)$hydrocarbyl, or a $(C_3-C_8)$hydrocarbyl. Alternatively each X is Cl. Alternatively, each hydrocarbyl is an unsubstituted alkyl, a substituted alkyl, an unsubstituted aryl, or an alkyl-substituted aryl. Alternatively or additionally, at least one $(C_1-C_{20})$ hydrocarbyl independently is unsubstituted or substituted $(C_1-C_5)$alkyl or unsubstituted or substituted phenyl. Alternatively or additionally, at least one $(C_1-C_{20})$hydrocarbyl independently is unsubstituted $(C_1-C_5)$alkyl, phenyl, or substituted phenyl.

Aspect 10. The thiodisilane of aspect 9 wherein each hydrocarbyl is an unsubstituted alkyl, a substituted alkyl, an unsubstituted aryl, or an alkyl-substituted aryl.

Aspect 11. The thiodisilane of aspect 1 of formula (I-a): $(R^{1a}R^{1b}R^{1c}CS)_s(Si-Si)H_h$ (I-a), wherein: subscript s is an integer from 1 to 6; subscript h is an integer from 0 to 5; with the proviso that sum s+h=6; and wherein $R^{1a}$, $R^{1b}$, and $R^{1c}$ are as defined above for formula (I). Alternatively, s is 1 to 5, alternatively s is 1 to 4, alternatively s is 1 to 3, alternatively s is 1 or 2, alternatively s is 2 to 6, alternatively s is 2 to 5, alternatively s is 2 to 4, alternatively s is 2 or 3, alternatively s is 1; alternatively s is 2, alternatively s is 3, alternatively s is 4, alternatively s is 5, alternatively s is 6.

Aspect 12. The thiodisilane of aspect 11 wherein subscript s is an integer from 1 to 3; subscript h is an integer from 3 to 5; and each $(C_1-C_{20})$hydrocarbyl independently is an unsubstituted $(C_1-C_6)$alkyl, substituted $(C_1-C_6)$alkyl, unsubstituted aryl, or a $(C_1-C_3)$alkyl-substituted $(C_6)$aryl.

Aspect 13. The thiodisilane of aspect 12 selected from (1,1-dimethylethylthio)disilane; 1,2-bis(1,1-dimethylethylthio)disilane; 1,1-bis(phenylthio)disilane; 1,2-bis(phenylthio)disilane; (phenylthio)disilane; bis(phenylthio)disilane; (2-methylphenylthio)disilane; bis(2-methylphenylthio)disilane; (2,6-dimethyl-phenylthio)disilane; (t-pentylthio)disilane; bis(t-pentylthio)disilane; (benzylthio)disilane; bis(benzylthio)disilane; (2,6-dimethylphenylthio)disilane; bis(2,6-dimethylphenylthio)disilane; bis(1,2-dimethylpropylthio) disilane; and (1,2-dimethylpropylthio)disilane.

Aspect 14. The thiodisilane of aspect 12 selected from: 1,2-bis(1,1-dimethylethylthio)disilane; 1,1-bis(phenylthio) disilane; 1,2-bis(2-methyl-phenylthio)disilane; 1,2-bis(2,6-dimethyl-phenylthio)disilane; 1,2-bis(benzylthiol)disilane; and 1,2-bis(1,2-dimethylpropylthio)disilane.

Aspect 15. The thiodisilane of any preceding aspect further being a liquid and/or having a predicted boiling point of from 100 degrees Celsius (° C.) to less than 400° C., wherein the predicted boiling point is determined according to Boiling Point Test Method 1.

Aspect 16. A method of synthesizing a thiodisilane, the method comprising contacting an aminodisilane of formula (II): $(R^2{}_2N)_{(n+s)}(Si-Si)H_h$ (II) with an organothiol of formula (III): $R^{1a}R^{1b}R^{1c}CSH$ (III) to give a thiodisilane of formula (IV): $(R^{1a}R^{1b}R^{1c}CS)_s(R^2{}_2N)_n(Si-Si)H_h$ (IV), Wherein: subscript s is an integer from 1 to 6; subscript n is an integer from 0 to 5; subscript h is an integer from 0 to 5; with the proviso that sum s+n+h=6; each H, when present in formula (IV) (i.e., when subscript h is 1 to 5), is independently bonded to the same or different one of the silicon atoms in formulas (IV); wherein $R^{1a}$, $R^{1b}$, and $R^{1c}$ are defined by limitation (a), (b), or (c): (a) at least one $R^{1a}$ independently is $(C_2-C_{20})$alkyl and each of any remaining $R^{1a}$, $R^{1b}$, and $R^{1c}$ independently is H or $(C_1-C_{20})$hydrocarbyl; or (b) there is at least one group $R^{1a}R^{1b}$, and $R^{1c}C$ that independently is a substituted $(C_6-C_{20})$aryl and each of any remaining $R^{1a}$, $R^{1b}$, and $R^{1c}$ independently is H or $(C_1-C_{20})$ hydrocarbyl; or (c) any two of $R^{1a}$, $R^{1b}$, and $R^{1c}$ (collectively $R^1$ groups), in the same or different $R^{1a}R^{1b}R^{1c}C$ group, are bonded together to form a divalent group, —R$^{11}$—, wherein —R$^{11}$— is a CH$_2$ or a (C$_3$-C$_{20}$)hydrocarbylene and each of any remaining R$^{1a}$, R$^{1b}$, and R$^{1c}$ independently is H or (C$_1$-C$_{20}$)hydrocarbyl; each R$^2$ group independently is H or a (C$_1$-C$_{20}$)hydrocarbyl; or any two R$^2$ groups may be bonded together to form a divalent group, —R$^{22}$—, wherein —R$^{22}$— is a (C$_2$-C$_{20}$)hydrocarbylene and each of any remaining R$^2$ groups independently is H or a (C$_1$-C$_{20}$)hydrocarbyl; each hydrocarbyl and hydrocarbylene independently is unsubstituted or substituted with from 1 to 5 substituents SUB; and each SUB independently is unsubstituted (C$_1$-C$_5$)alkyl, unsubstituted (C$_3$-C$_5$)cycloalkyl, unsubstituted (C$_2$-C$_5$)alkenyl, unsubstituted (C$_2$-C$_5$)alkynyl, unsubstituted (C$_6$-C$_7$)aryl, fluoro, chloro, or bromo. Alternatively, the thiodisilane is of any one of aspects 1 to 15. Each R$^{1a}$R$^{1b}$R$^{1c}$CS group is independently bonded at its sulfur atom to the same or different one of the silicon atoms in formula (IV). In some embodiments at least one, alternatively each R$^{1a}$R$^{1b}$R$^{1c}$CS group is a monovalent group (having a radical at S). Alternatively, at least one, alternatively each R$^{1a}$R$^{1b}$R$^{1c}$CS group is a divalent group (having a first radical at S and a second radical at either C or R$^{1a}$). The group R$^{1a}$R$^{1b}$R$^{1c}$C that independently is a substituted (C$_6$-C$_{20}$)aryl means R$^{1a}$, R$^{1b}$, and R$^{1c}$ taken together with the carbon atom C form a substituted (C$_6$-C$_{20}$)aryl. Each R$^2_2$N group in formula (II) and, when present, in formula (IV) (i.e., when subscript n is 1 to 5), is independently bonded at its nitrogen atom to the same or different one of the silicon atoms in formula (II) or (IV), respectively. In some embodiments at least one, alternatively each R$^2_2$N group is a monovalent group (having a radical at N). Alternatively, at least one, alternatively each R$^2_2$N group is a divalent group (having a first radical at N and a second radical at either N or at R$^2$). In some embodiments, the method of synthesizing the thiodisilane of formula (I) further comprises a step of purifying same to give the thiodisilane of formula (I) in neat form, having a purity from ≥95% to 100%. The step of purifying may comprise any suitable separation or purification method such as the methods described later. E.g., any one or more of chromatography, extracting, stripping, evaporating, distilling, fractionally distilling, crystallizing, and decanting. In some embodiments the purifying step comprises fractionally distilling the thiodisilane of formula (I).

Aspect 17. The method of synthesizing of aspect 16 wherein subscript n is 0 in formula (IV), the method comprising contacting an aminodisilane of formula (II-a): (R$^2_2$N)$_s$(Si—Si)H$_h$ (II-a) with s mole equivalents, relative to moles of the aminodisilane, of the organothiol of formula (III): R$^{1a}$R$^{1b}$R$^{1c}$CSH (III) to give a thiodisilane of formula (IV-a): (R$^{1a}$R$^{1b}$R$^{1c}$CS)$_s$(Si—Si)H$_h$ (IV-a), Wherein: subscripts is an integer from 1 to 6; subscript h is an integer from 0 to 5; with the proviso that sum s+h=6; and wherein R$^{1a}$, R$^{1b}$, R$^{1c}$, and R$^2$ are as defined above for formula (IV).

Aspect 18. The method of synthesizing of 16 or 17 wherein s is 1 and h is 5.

Aspect 19. The method of synthesizing of any one of aspects aspect 16 to 18 wherein each R$^{1a}$, R$^{1b}$, and R$^{1c}$ independently is an unsubstituted (C$_1$-C$_6$)alkyl, substituted (C$_1$-C$_6$)alkyl, unsubstituted aryl, or a (C$_1$-C$_3$)alkyl-substituted (C$_6$)aryl; and each R$^2$ independently is an unsubstituted (C$_1$-C$_6$)alkyl or unsubstituted (C$_3$-C$_6$)cycloalkyl; or two R$^2$ are bonded together to form, —R$^{22}$—, wherein —R$^{22}$— is an unsubstituted (C$_2$-C$_6$)alkylene.

Aspect 20. The method of synthesizing of any one of aspects 16 to 19 wherein the thiodisilane of formula (IV) is a liquid and/or has a predicted boiling point of from 100 degrees Celsius (° C.) to less than 400° C., wherein the predicted boiling point is determined according to Boiling Point Test Method 1.

Aspect 21. A thiosilane of formula (A): (R$^{1a}$R$^{1b}$R$^{1c}$CS)$_s$(Si)X$_x$H$_h$ (A), Wherein: subscript s is an integer from 2 to 4; subscript x is an integer from 0 to 2; subscript h is an integer from 0 to 2; with the proviso that sum s+x+h=4; each X is a monovalent halogen atom F, Cl, or Br; wherein R$^{1a}$, R$^{1b}$, and R$^{1c}$ are defined by limitation (a), (b), or (c): (a) R$^{1a}$ is (C$_1$-C$_6$)alkyl, R$^{1b}$ is (C$_2$-C$_6$)alkyl or H, alternatively (C$_2$-C$_6$)alkyl, alternatively H, and R$^{1c}$ is H; or (b) each of R$^{1a}$, R$^{1b}$, and R$^{1c}$ independently is (C$_1$-C$_6$)alkyl; (c) R$^{1a}$R$^{1b}$R$^{1c}$C together represents a substituted or unsubstituted phenyl group, wherein the substitute groups on the phenyl are one or more methyl groups; each alkyl independently is unsubstituted or substituted with from 1 to 5 substituents SUB; and each SUB independently is unsubstituted (C$_1$-C$_6$)alkyl, unsubstituted (C$_3$-C$_6$)cycloalkyl, unsubstituted (C$_2$-C$_6$)alkenyl, unsubstituted (C$_2$-C$_6$)alkynyl, unsubstituted (C$_6$-C$_7$) aryl, fluoro, chloro, or bromo. Alternatively, s is 2 or 3, alternatively s is 2 or 4, alternatively s is 3 or 4, alternatively s is 1 or 2, alternatively s is 2, alternatively s is 3, alternatively s is 4. Each R$^{1a}$R$^{1b}$R$^{1c}$CS group is bonded at its sulfur atom to the silicon atom in formula (A). In some embodiments at least one, alternatively each R$^{1a}$R$^{1b}$R$^{1c}$CS group is monovalent group (having a radical at S). Alternatively, at least one, alternatively each R$^{1a}$R$^{1b}$R$^{1c}$CS group is a divalent group (having a radical at S and at either C or R$^{1a}$). In some embodiments, any aspect of the thiosilane of formula (A) may be characterized as being in neat form, having a purity from ≥95% to 100%. The neat form of any such aspect of the thiosilane of formula (A) may be molecularly stable at ambient storage and transportation temperatures (e.g., 20° to 30° C.).

Aspect 22. The thiosilane of aspect 21 wherein s is 2, x is 2, and h is 0.

Aspect 23. The thiosilane of aspect 21 or 22 wherein R$^{1a}$ is (C$_1$-C$_6$)alkyl, R$^{1b}$ is (C$_3$-C$_6$)alkyl, and R$^{1c}$ is H. Alternatively each alkyl is unsubstituted.

Aspect 24. The thiosilane of aspect 23 wherein R$^{1a}$ is (C$_1$-C$_2$)alkyl, R$^{1b}$ is (C$_3$-C$_4$)alkyl, and R$^{1c}$ is H. Alternatively each alkyl is unsubstituted.

Aspect 25. The thiosilane of aspect 21 or 22 wherein each of R$^{1a}$, R$^{1b}$, and R$^{1c}$ independently is (C$_1$-C$_6$)alkyl. Alternatively each alkyl is unsubstituted.

Aspect 26. The thiosilane of aspect 25 wherein each of R$^{1a}$, R$^{1b}$, and R$^{1c}$ independently is (C$_1$-C$_2$)alkyl. Alternatively each alkyl is unsubstituted.

Aspect 27. Bis(1,1-dimethylethylthio)silane; bis(1,2-dimethylpropylthio)silane; dichloro-bis(1,2-dimethylpropylthio)silane; t-pentylthiosilane; bis(phenylthio)silane; phenylthiosilane; (benzylthio)silane; (2-methylphenylthio) silane; bis(2-methylphenylthio)silane; (2,6-dimethylphenylthio)silane; bis(2,6-dimethylphenylthio) silane; or bis(2-methyl-phenylthio)silane.

Aspect 28. The thiosilane of any one of aspects 21-27 further being a liquid and/or having a predicted boiling point of from 100 degrees Celsius (° C.) to less than 400° C., wherein the predicted boiling point is determined according to Boiling Point Test Method 1.

Aspect 29. A method of synthesizing a thiosilane, the method comprising contacting an aminosilane of formula (B): (R$^2_2$N)$_s$(Si)H$_h$ (B) with an organothiol of formula (C): R$^{1a}$R$^{1b}$R$^{1c}$CSH (C) to give a thiosilane of formula (D): (R$^{1a}$R$^{1b}$R$^{1c}$CS)$_s$(Si)H$_h$ (D), Wherein: subscript s is an integer from 1 to 4; subscript h is an integer from 0 to 3; with the proviso that sum s+h=4; each R$^2$ group independently is H or a ($C_1$-$C_{20}$)hydrocarbyl; or any two $R^2$ groups may be bonded together to form a divalent group, —$R^{22}$—, wherein —$R^{22}$— is a ($C_2$-$C_{20}$)hydrocarbylene and each of any remaining $R^2$ groups independently is H or a ($C_1$-$C_{20}$)hydrocarbyl; wherein $R^{1a}$, $R^{1b}$, and $R^{1c}$ are defined by limitation (a), (b), or (c): (a) $R^{1a}$ is ($C_1$-$C_6$)alkyl, $R^{1b}$ is ($C_2$-$C_6$)alkyl or H, and $R^{1c}$ is H; or (b) each of $R^{1a}$, $R^{1b}$, and $R^{1c}$ independently is ($C_1$-$C_6$)alkyl; (c) $R^{1a}R^{1b}R^{1c}C$ together represents a substituted or unsubstituted phenyl group, wherein the substitute groups on the phenyl are one or more methyl groups; each alkyl independently is unsubstituted or substituted with from 1 to 5 substituents SUB; and each SUB independently is unsubstituted ($C_1$-$C_6$)alkyl, unsubstituted ($C_3$-$C_6$)cycloalkyl, unsubstituted ($C_2$-$C_6$)alkenyl, unsubstituted ($C_2$-$C_6$)alkynyl, unsubstituted ($C_6$-$C_7$)aryl, fluoro, chloro, or bromo. Alternatively, the thiosilane is any one of aspects 21 to 28. Each $R^2_2N$ group is bonded at its nitrogen atom to the silicon atom in formula (B). In some embodiments at least one, alternatively each $R^2_2N$ group is a monovalent group (having a radical at N). Alternatively, at least one, alternatively each $R^2_2N$ group is a divalent group (having a first radical at N and a second radical at either N or at $R^2$). Each $R^{1a}R^{1b}R^{1c}CS$ group is bonded at its sulfur atom to the silicon atom in formula (D). In some embodiments at least one, alternatively each $R^{1a}R^{1b}R^{1c}CS$ group is a monovalent group (having a radical at S). Alternatively, at least one, alternatively each $R^{1a}R^{1b}R^{1c}CS$ group is a divalent group (having a first radical at S and second radical at either C or $R^{1a}$). In some embodiments, the method of synthesizing the thiosilane of formula (D) further comprises a step of purifying same to give the thiosilane of formula (D) in neat form, having a purity from ≥95% to 100%. The step of purifying may comprise any suitable separation or purification method such as the methods described later. E.g., any one or more of chromatography, extracting, stripping, evaporating, distilling, fractionally distilling, crystallizing, and decanting. In some embodiments the purifying step comprises fractionally distilling the thiosilane of formula (D).

Aspect 30. The method of synthesizing of 29 wherein s is 2 and h is 2.

Aspect 31. The method of synthesizing of aspect 29 or 30 wherein $R^{1a}$ is ($C_1$-$C_6$)alkyl, $R^{1b}$ is ($C_3$-$C_6$)alkyl, and $R^{1c}$ is H; or wherein $R^{1a}$ is ($C_1$-$C_2$)alkyl, $R^{1b}$ is ($C_3$-$C_4$)alkyl, and $R^{1c}$ is H; or wherein each of $R^{1a}$, $R^{1b}$, and $R^{1c}$ independently is ($C_1$-$C_6$)alkyl; or wherein each of $R^{1a}$, $R^{1b}$, and $R^{1c}$ independently is ($C_1$-$C_2$)alkyl.

Aspect 32. The method of aspect 29 wherein the aminosilane of formula (B) is bis(di($C_2$-$C_6$)alkylamino)silane, the organothiol of formula (C) is 1,1-dimethylethylthiol or 1,2-dimethylpropylthiol and the thiosilane of formula (D) is bis(1,1-dimethylethylthio)silane or bis(1,2-dimethylpropylthio)silane.

Aspect 33. A composition comprising a mixture of bis(1,1-dimethylethylthio)silane and 1,1-dimethylethylthiosilane; or a mixture of bis(1,2-dimethylpropylthio)silane and 1,2-dimethylpropylthiosilane.

Aspect 34. A composition comprising a mixture of a thiodisilane of any one of aspects 1 to 15. The composition may comprise a mixture of the thiodisilane of any one of aspects 1 to 15.

Aspect 35. A composition comprising a mixture of a thiosilane of any one of aspects 21 to 28 and any one of the thiodisilanes named in aspect 13. The composition may comprise a mixture of the thiosilane of any one of aspects 21 to 28 and any one of the thiodisilanes named in aspect 13, alternatively a mixture of the thiosilane of any one of aspects 21 to 28 and any one of the thiosilanes named in aspect 14.

Aspect 36. Lithium (1,2-dimethylpropyl)thiolate or lithium 1,1-dimethylethylthiolate.

Aspect 37. In some embodiments is the aminodisilane of formula (II): $(R^2_2N)_{(n+s)}(Si—Si)H_h$ (II), wherein $R^2$ and subscripts n, s and h are as defined above therefor. In other embodiments is the organothiol of formula (III): $R^{1a}R^{1b}R^{1c}SCH$ (III), wherein $R^{1a}$, $R^{1b}$, and $R^{1c}$ are as defined above therefor. In still other embodiments is the thiodisilane of formula (IV): $(R^{1a}R^{1b}R^{1c}CS)_s(R^2_2N)_n(Si—Si)H_h$ (IV), wherein $R^{1a}$, $R^{1b}$, $R^{1c}$, $R^2$ and subscripts n, s and h are as defined above therefor. In some embodiments is the thiodisilane of formula (IV-a): $(R^{1a}R^{1b}R^{1c}CS)_s(Si—Si)H_h$ (IV-a), wherein $R^{1a}$, $R^{1b}$, $R^{1c}$, $R^2$ and subscripts s and h are as defined above therefor.

Aspect 38. In some embodiments is the aminosilane of formula (B): $(R^2_2N)_s(Si)H_h$ (B), wherein $R^2$ and subscripts s and h are as defined above therefor. In other embodiments is the organothiol of formula (C): $R^{1a}R^{1b}R^{1c}CSH$ (C), wherein $R^{1a}$, $R^{1b}$, and $R^{1c}$ are as defined above therefor. In still other embodiments is the thiosilane of formula (D): $(R^{1a}R^{1b}R^{1c}CS)_s(Si)H_h$ (D), wherein $R^{1a}$, $R^{1b}$, $R^{1c}$, $R^2$ and subscripts s and h are as defined above therefor.

Additional invention embodiments, uses and advantages are described below.

The invention has technical and non-technical advantages. The inventive thiosilanes of formula (A), such as bis(1,1-dimethylethylthio)silane and bis(1,2-dimethylpropylthio)silane, are molecularly stable at room temperature in neat form (purity ≥95% to 100%). But bis(alkylthio)silanes have less bulky alkyl groups such as isopropyl or isobutyl, and turn out to be molecularly unstable at room temperature in neat form and instead spontaneously redistribute (i.e., a bis(alkylthio)silane forms a mono(alkylthio)silane and tris(alkylthio)silane). 1,1-dimethylethylthiosilane and 1,2-dimethylpropylthiosilane are also molecularly unstable at room temperature in neat form and instead spontaneously redistribute to form degradation mixtures. The degradation mixtures are of unknown composition and cannot be used as silicon-yielding precursors in (purity or compositionally) sensitive applications such as making Si-containing films for electronic devices, but may have other uses. The 1,1-dimethylethylthiosilane and 1,2-dimethylpropylthiosilane are formed as degradation intermediates generated from degradation of the respective inventive bis(1,2-dimethylpropylthio)silane or bis(1,2-dimethylpropylthio)silane. Formally, two molecules of bis(1,1-dimethylethylthio)silane or two molecules of bis(1,2-dimethylpropylthio)silane undergo a bimolecular reaction (redistribution reaction). The redistribution reactions give a degradation mixture of 1,1-dimethylethylthiosilane and tris(1,1-dimethylethylthio)silane or a degradation mixture of 1,2-dimethylpropylthiosilane and tris(1,2-dimethylpropylthio)silane, respectively. In turn, the 1,1-dimethylethylthiosilane undergoes another bimolecular degradation reaction (redistribution reaction) with another molecule of bis(1,1-dimethylethylthio)silane to give $SiH_4$ and more of the corresponding tris(1,1-dimethylethylthio)silane. Similarly, the 1,2-dimethylpropylthiosilane undergoes another bimolecular degradation reaction (redistribution reaction) with another molecule of bis(1,2-dimethylpropylthio)silane to give $SiH_4$ and more of the corresponding tris(1,2-dimethylpropylthio)silane. One embodiment of the invention has the proviso that the silane is not a bis(alkylthio)silanes having less bulky alkyl groups such as isopropyl or isobutyl, alternatively bis(alkylthio)silanes have less bulky alkyl groups such as isopropyl or isobutyl including, 1,1-dimethylethylthiosilane and 1,2-dimethylpropylthiosilane, alternatively 1,1-dimethylethylthiosilane and 1,2-dimethylpropylthiosilane.

The inventive thiodisilanes of formula (I), such as (1,2-dimethylpropylthio)disilane, (phenylthio)disilane, and (2-methylphenylthio)disilane, are molecularly stable at room temperature in neat form (purity ≥95% to 100%) for similar reasons. The purity of any one of the thio(di)silanes may be determined according to the method described later.

The invention may have additional advantages and uses, some of which may be described later.

This invention is described herein in an illustrative manner by disclosing a plurality of representative, non-limiting inventive embodiments, aspects, and examples thereof. The description may be by way of explicit statements, unambiguous contextual indications, or incorporations by reference to a US patent, US patent application, or US patent application publication to the extent that incorporated subject matter does not conflict with the present description, which would control in any such conflict. Taken together they enable a person of ordinary skill in the art to understand how to make and use the invention without undue experimentation. The description uses certain terms, phrases and expressions that may be readily understood by a skilled artisan and for convenience are defined below in the immediately following five paragraphs. These definitions control unless a different meaning of a term, phrase or expression is stated or clearly indicated from the context of the description elsewhere herein.

The terms aspect and embodiment are used interchangeably. Any inventive example referenced herein may be relied upon and provides adequate support for specific inventive embodiments. Any reference to "invention" or an equivalent expression (e.g., the present invention, this invention or the invention) shall mean those representative inventive embodiments or aspects, and shall not be used to unduly limit inventive scope. Any reference to a Markush group may be equivalently expressed in different ways. E.g., a Markush group of members A, B, and C may be equivalently expressed as: "a member selected from A, B, and C"; "a member selected from the group consisting of A, B, and C"; or "a member A, B, or C". The Markush group may comprise two or more of a genus, a subgenus thereof, and one or more specific members thereof; each of which may be relied upon individually or collectively and provides adequate support for specific inventive embodiments.

Any use of alternatively shall indicate an independent embodiment. The articles "a", "an", and "the" each refer to one or more. Any reference to "comparative," as in comparative example, is for illustration purposes only and shall not mean something from the prior art. Any reference to "contacting" means bringing into physical contact. Any reference to "greater than", as in greater than a specified individual number (e.g., >50 or ≥50), encompasses a range or subrange that includes as its upper endpoint the absolute maximum (e.g., 100%) or, as the case may be where there is no absolute maximum, a practical maximum (e.g., 10,000 repeat units or 10,000,000 g/mol. Alternatively, the upper endpoint may be less than the absolute maximum (e.g., <100%) or less than the practical maximum (e.g., <10,000 repeat units or <10,000,000 g/mol). Any reference to "lack" means free of or a complete absence of. Any reference to "less than", as in less than a specified individual number (e.g., <10 or ≤10), encompasses a range or subrange that includes as its lower endpoint the absolute minimum (e.g., zero (0)) or, as the case may be where there is no absolute minimum, a practical minimum (e.g., greater than zero (>0).

E.g., a practical minimum >0 is clear from the context of the expression "present at a concentration less than 10 wt %". Alternatively, the lower endpoint may be greater than the absolute minimum (e.g., >0%). Any use of "may" confers a choice, not an imperative. Any use of "operative" means functionally effective. E.g., "operative contact" comprises functionally effective touching, e.g., as for modifying, coating, adhering, sealing, or filling. The operative contact may be direct physical touching, alternatively indirect touching, provided it is effective for its intended purpose. Any use of "optionally" means is absent (or excluded), alternatively is present (or included). Any ranges relied upon herein describe and contemplate all ranges and subranges including endpoints and whole and/or fractional values therein. A disclosed endpoint or individual number between endpoints of a disclosed range or subrange may be relied upon and provides adequate support for specific inventive embodiments. Any reference to thereof shall refer to, and may be amended to be replaced by, that immediately preceding element, member, feature, limitation, list, or group to which reference is being made.

Any reference to an amount, concentration, or ratio of amounts is based on weight. Any reference to a "by-product" means a secondary product of a chemical transformation of one or more reactants. Any reference to "concentration" as a "percent" or "%" means weight percent (wt %) and is based on total weight of all ingredients used to make the material being described, which total weight is 100 wt %. Any reference to "decomposition" means chemical decomposition, which is the breakdown of a single molecular entity (a collection of molecules having a same structure) into two or more fragments. The fragments may combine to form one or more breakdown product molecules that are different in structure than the structure of the single molecular entity. In types of chemical decompositions where the breakdown product molecules are suitable for the application, use or purpose for with the single molecular entity is intended, the decomposition may be referred to as a non-degradative decomposition. Any reference to "degradation" means a type of chemical decomposition wherein the one or more breakdown product molecules are unsuitable for the application, use or purpose for which the single molecular entity is intended. Any reference to "disproportionation" means a reaction where a single molecular entity forms two or more different molecular entities having different structures and formal oxidation states relative to those of the single molecular entity. Any reference to a "film" or "coating" means a material that is restricted in one dimension. The restricted dimension may be characterized as "thickness". Any reference to a material property (e.g., viscosity) or a test method for measuring same shall be that property measured at or that method conducted at 23 degrees Celsius (° C.) and 101.3 kilopascals (kPa). Any reference to "molecular instability" means chemical instability or a state of being thermodynamically unstable (in neat form) at ambient temperature (e.g., 20° to 30° C.). E.g., a chemical structure that spontaneously undergoes redistribution or disproportionation. In contrast, molecular stability means chemical stability or a state of being thermodynamically stable (in neat form) at ambient temperature, e.g., after 1 day, 1 week, 1 month or longer, such as evidenced by a lack of appreciable change in $^1$H-NMR or $^{29}$Si-NMR or GC. Any reference to a "molecular mass" of a molecule means molecular weight (MW) expressed in grams per mole and any reference to an average molecular mass of a polymer means weight average molecular weight ($M_W$) expressed in grams. $M_W$ is determined using gel permeation chromatography (GPC) with polystyrene standards. Any reference to "purify" means to increase concentration of a desired ingredient (up to ≤100%); alternatively to decrease concentration of one or more undesired ingredients (down to ≥0%), whether or not concentration of the desired ingredient has been increased; alternatively both. Any reference to "redistribution" means a reaction where a single molecular entity forms two or more different molecular entities having different structures but the same formal oxidation state relative to those of the single molecular entity. Any reference to a "remainder" means a portion that is left behind, e.g., a pot residue after a distillation. Any reference to "separation" means to cause to physically move apart, and thus as a result be no longer in direct touching. Any reference to "substrate" means a physical support having at least one surface upon which another material may be hosted. Any reference to a "vehicle" means a material acting as a carrier, hosting medium, dispersion medium, supernatant, or solvent for another material, which may or may not be soluble therein. The vehicle may be a liquid.

Any reference to a chemical element, a Group or Groups of chemical elements, or a Periodic Table of the Elements shall mean the chemical elements, Group(s), and Periodic Table of the Elements published by IUPAC, version dated 1 May 2013; see iupac.org/reports/periodic_table/). IUPAC is the International Union of Pure and Applied Chemistry (IUPAC Secretariat, Research Triangle Park, N.C., USA). The intended meaning of any chemical term is that definition promulgated by IUPAC. Any reference to "composition" means chemical matter that may be defined by an empirical formula of its constituent elements. Any organic group name ending in suffix "ene", such as hydrocarbylene, alkylene, alkenylene, alkynylene, arylene, phenylene, and the like, means a divalent radical group, which may be straight chain, branched chain, or cyclic. E.g., unsubstituted ($C_3$)hydrocarbylene includes cyclopropylene, methylethylene, and propylene, wherein cyclopropylene means cyclopropane-1,2-diyl; methylethylene means 1-methyl-ethane-1,2-diyl (i.e., propane-2,3-diyl) or 2-methyl-ethane-1,2-diyl (i.e., propane-1,2-diyl); and propylene means propane-1,3-diyl. Any organic group containing a C—H functionality independently may be unsubstituted or substituted with one or more substituents. Each substituent independently may be SUB, wherein each SUB independently is a halogen atom, —$NH_2$, —NHR, —$NR_2$, —$NO_2$, —OH, —OR, oxo (=O), —C≡N, —C(=O)—R, —OC(=O)R, —C(=O)OH, —C(=O)OR, —SH, —SR, —SSH, —SSR, —SC(=O)R, —$SO_2R$, —$OSO_2R$, —$SiR_3$, and —$Si(OR)_3$; wherein each R independently is an unsubstituted ($C_1$-$C_{30}$)hydrocarbyl. Halogen atom is F, Cl, Br, or I; alternatively F, Cl, or Br; alternatively F or Cl; alternatively F; alternatively Cl. A "thiol" is a compound having a C—SH group. An organic group may be monovalent (having one free valence), divalent (having two free valences), trivalent (having three free valences), or tetravalent (having four free valences), also known as univalent, bivalent, trivalent, and quadravalent. Examples of monovalent organic groups are organyl or organoheteryl groups. Examples of organyl groups are hydrocarbyl and heterohydrocarbyl groups. Examples of organoheteryl groups are hydrocarbylamino and hydrocarbyloxy groups. Examples of divalent organic groups are organylene and organoheterylene groups. Examples of organylene groups are hydrocarbylene and heterohydrocarbylene groups. Examples of organoheterylene groups are hydrocarbyleneamino and hydrocarbyleneoxy groups. Heterohydrocarbyl, heterohydrocarbylene, organoheteryl and organoheterylene groups contain one or more heteroatoms selected from O, N, S, and P; alternatively O, N, or S; alternatively O or N; alternatively N; alternatively O.

Any reference to "deposition" in a vapor or atomic layer method means generating, on a specific place, condensed matter. The condensed matter may or may not be restricted in dimension. Examples of deposition are film-forming, rod-forming, and particle-forming depositions. Any reference to a "rod" means a material restricted in two dimensions, e.g., having an aspect ratio >2. Any reference to "silicon-yielding precursor" means a substance or molecule containing atoms of element 14 and being useful as a source of silicon in a deposition method. Examples of such deposition methods are described later. Any reference to "thio(di)silane" means the thiosilane of formula (A), the thiodisilane of formula (I), and any subgenuses thereof (e.g., formulas (I-a), (IV), (IV-a), and (D)). The "thio(di)silane" is a generic term for "thiosilane or thiodisilane." The terms "thiosilane" and "thiomonosilane" are used interchangeably herein and mean a molecule or collection of molecules containing atoms that include, among others, from 2 to 4 sulfur atoms and only 1 silicon atom, wherein each sulfur atom is directly covalently bonded to the silicon atom. The term "thiodisilane" means a molecule or collection of molecules containing atoms that include, among others, from 1 to 6 sulfur atoms and only 2 silicon atoms, wherein each sulfur atom independently is directly covalently bonded to the same or different one of the silicon atoms, with the proviso that no more than 4 sulfur atoms are bonded to any one of the silicon atoms.

The inventive thio(di)silanes may differ from each other in at least one property, function, and/or use. Each of the different thio(di)silanes has unique properties such as a unique vapor pressure, a unique chemical reactivity, a unique deposition rate, a unique molecular symmetry, molecular dipole moment and chemical bonding characteristics, or a combination of any two or more thereof. These unique properties affect physisorption and chemisorption of the substructure on a substrate surface in deposition processes such as CVD or ALD processes. The inventive thio(di)silanes may be further defined as being any one of the species thereof described later in the working examples.

The inventive thio(di)silanes may be further defined by their isotopic compositions. The thio(di)silanes may be a natural abundance isotope form, alternatively an isotopically-enriched form, alternatively a mixture of said forms. The isotopically-enriched forms of the thio(di)silanes include forms that contain a greater-than-natural-abundance amount of deuterium, tritium, $^{29}Si$, $^{30}Si$, $^{32}Si$, or a combination of any two or more thereof. In addition to the uses of the thio(di)silanes described herein, isotopically-enriched forms of the thio(di)silanes may be useful in applications wherein detection of the isotopically-enriched thio(di)silanes or an isotopically-enriched silicon material (e.g., film) made therefrom would be helpful. Examples of such applications are medical research and anti-counterfeiting applications. The thio(di)silanes having different isotopic compositions may differ from each other in at least one property, function, and/or use.

The inventive thio(di)silanes may be stored and transported in neat form (purity ≥95% to 100%) under an anhydrous condition (i.e., lacking water), under an inert atmosphere, or, typically, both, i.e., anhydrous inert atmosphere. The inert atmosphere may be a gas of molecular nitrogen, helium, argon, or a mixture of any two or more thereof. Transportation of the thio(di)silane may be from a first reactor in which the thio(di)silane is synthesized to a second reactor in which the thio(di)silane is used as sulfur-containing silicon-yielding precursors. The first reactor may be a continuous stirred-tank reactor, a plug flow reactor, a semi-batch reactor, or a catalytic reactor. The second reactor may be a CVD or ALD reactor.

Another aspect of the invention is a composition comprising the thio(di)silane and at least one additional ingredient that is different than the thio(di)silane. Each additional ingredient independently may independently differ from the thio(di)silane in function, composition, or structure. In some aspects the composition comprises a thiosilane of formula (A) and a thiodisilane of formula (I). In some aspects, the at least one additional ingredient may be a silane that is different than the thio(di)silane.

The at least one, alternatively each additional ingredient independently may comprise a silicon-yielding precursor other than the thio(di)silane. Examples are a hydridosilane such as monosilane, disilane, trisilane, tetrasilane, pentasilane, hexasilane, heptasilane, octasilane, or nonasilane; or an organosilicon such as an organosilane such as trimethyl- or tetramethyl-monosilane, dichlorodimethyl-monosilane, or chlorotrimethyl-monosilane, or a silaalkane such as 1,3-disilabutane); alternatively an aminosilane or aminodisilane such as diisopropylaminosilane or diisopropylaminodisilane, respectively; alternatively an organic precursor lacking silicon (e.g., an alkane such as methane, including natural gas; carbon tetrachloride; propane; hexane; or a mixture of any two or more thereof), alternatively an inorganic precursor lacking silicon (e.g., anhydrous ammonia, molecular nitrogen, hydrazine, molecular oxygen, ozone, nitrous oxide, water, or hydrogen peroxide), alternatively a mixture thereof. Additionally or alternatively, the additional precursor may be a source of carbon comprising a carbon-containing precursor (e.g., the organosilicon), a source of oxygen comprising an oxygen-containing precursor (e.g., molecular oxygen, ozone, nitrous oxide, water, or hydrogen peroxide), or a source of nitrogen comprising nitrogen-containing precursor (e.g., anhydrous ammonia, molecular nitrogen, or hydrazine), or a combination of any two or more of the source of carbon comprising a carbon-containing precursor, the source of oxygen comprising an oxygen-containing precursor, and the source of nitrogen comprising nitrogen-containing precursor. The additional precursor may function as a solvent for the compound of formula (I), or vice versa, in the composition. The composition that comprises the thio(di)silane and an additional ingredient that contains C or N or O or S may help to deliver the thio(di)silane to a film-forming reactor or help convert the thio(di)silane to a desirable silicon film.

Alternatively or additionally, in the composition the at least one additional ingredient may be a vehicle or carrier gas for a precursor such as a solvent or carrier gas for the thio(di)silane. The carrier gas may be a noble gas such as a gas of He or Ar. The vehicle may be an organic solvent lacking Si. The organic solvent may also function as a source of carbon-containing precursor; alternatively the source of carbon-containing precursor may also function as an organic solvent in the composition.

The thio(di)silane may be synthesized in and the resulting reaction mixture may comprise a hydrocarbon vehicle. The hydrocarbon vehicle may consist of carbon and hydrogen atoms or a may be halogenated hydrocarbon vehicle consisting of carbon, hydrogen, and halogen atoms. The hydrocarbon vehicle consisting of C and H atoms may be alkanes, aromatic hydrocarbons, and mixtures of any two or more thereof. The alkanes may be hexanes, cyclohexane, heptanes, isoparaffins, or mixtures of any two or more thereof. The aromatic hydrocarbon may be toluene, xylenes, or mixtures of any two or more thereof. The halogenated hydrocarbon vehicle may be dichloromethane. The hydrocarbon vehicle may remain in the reaction mixture after the synthesis is performed; alternatively the hydrocarbon vehicle may be removed from the reaction mixture after the synthesis is performed.

The synthesis of the thio(di)silane may comprise one or more contacting steps. The contacting steps independently may further comprise agitating the reactants. The agitating may enhance mixing and contacting together of the reactants and additional ingredients in the reaction mixture. The contacting steps independently may use other conditions, with or without the agitating. The other conditions may be tailored to enhance the contacting, and thus improve the reaction, of the reactants so as to form the intended reaction product in a particular contacting step. The other conditions may be result effective conditions for enhancing reaction yield or minimizing amount of a particular reaction by-product. Examples of the other conditions are reaction atmosphere (gaseous environment in which the reaction is conducted), reaction temperature, and reaction pressure. For example, the contacting steps independently may be performed under an inert gas atmosphere such as a bleed of anhydrous argon or helium gas. Alternatively or additionally, the contacting steps independently may comprise a temperature of the reactants of from a minimum temperature at which said reaction can be appreciated, up to the lower of the boiling point of the lowest boiling ingredient at a pressure employed. Reaction may be appreciated by detecting disappearance of reactants or appearance of product, e.g., by $^{29}$Si and/or $^1$H nuclear magnetic resonance (NMR) spectroscopy. For example, the contacting steps independently may comprise a temperature of the reactants of from −80° to 200° C., alternatively from −20° to 150° C., alternatively from 20° to 120° C., alternatively from 30° to 100° C. The contacting steps independently may be performed under less than ambient pressure, e.g., less than 101.3 kilopascals, and therefore the aforementioned specified temperatures may be lowered in relation to the lowering of the pressure. The conditions used in the different ones of the contacting steps may be the same as or different than the conditions used in any other contacting step(s) and/or the separating steps described herein.

In some aspects the reaction mixture containing the synthesized thio(di)silane is used directly as obtained from the contacting step without purification. For example, the reaction mixture may be stored until future use (e.g., in cold storage having temperature −50° C.) or may be characterized directly for presence and amount of the thio(di)silane contained therein. In other aspects the method of synthesizing the thio(di)silane may be further defined by one or more optional subsequent steps that come after the contacting step. The method may further comprise a subsequent step of separating the thio(di)silane from other thio(di)silane isomers, from the reaction by-product(s), from any unreacted reactants, from any additional reaction ingredient (e.g., vehicle), or from a combination of any two or more thereof, to give a purified thio(di)silane.

The separating step, when employed, may comprise any technique suitable for separating the thio(di)silane from the reaction by-product and any unreacted reactants or additional ingredients (e.g., vehicle). Different techniques may be preferred for different thio(di)silanes. One technique may be employed or a sequence of two or more techniques may be employed. A given technique may be performed one time or repeated two or more times, each time with a product of a prior technique in order to iteratively decrease impurity content to yield an iteratively purified thio(di)silane, e.g., a purified thio(di)silane having iteratively lower atomic concentrations of nitrogen. Examples of suitable techniques are decanting, distilling, evaporating, extracting, filtering, freeze drying, gas chromatography, ion exchange chromatography, partitioning, phase separating, reverse phase liquid chromatography, stripping, volatilizing, and washing. In some aspects the technique comprises fractional distillation or filtration followed by fractional distillation. Alternatively or additionally, the thio(di)silane may be subjected to reverse phase liquid chromatography. Examples of suitable reverse phase liquid chromatography techniques are reverse phase medium pressure column chromatography (RP-MPLC) and reverse phase high pressure column chromatography (RP-HPLC), wherein the stationary phase is a solid such as silica gel and the mobile phase is an anhydrous, aprotic organic solvent such as anhydrous hexanes, anhydrous acetonitrile, anhydrous ethyl acetate, or a mixture of any two or more thereof.

For example, in some aspects the contacting step may produce a reaction mixture having therein a solid carried over into the contacting step (from an optional preliminary step), and/or having therein a solid precipitate formed in situ as a reaction by-product during the contacting step. In these aspects the separating step may comprise filtering such a reaction mixture to remove the solids to give a filtrate containing the thio(di)silane and lacking solid reaction by-products. The filtrate may be distilled or stripped to remove volatile components therefrom to give a remainder containing a concentrated form of the thio(di)silane. The volatile components removed in this way are components having a lower boiling point than the boiling point of the thio(di)silane and may include, e.g., any unreacted starting materials and/or any reaction by-products.

Any reaction by-products and other ingredients of a reaction mixture having a lower boiling point than the boiling point of the thio(di)silane may be removed before removal of the thio(di)silane via an evaporative method to give a remainder comprising a concentrated form of the thio(di)silane. The thio(di)silane may be distilled or stripped from the remainder to give the purified thio(di)silane and leave behind a pot residue comprising a remainder containing any non-volatile reaction by-products and/or any non-volatile additional ingredients. The non-volatile components left behind in this way are components having a higher boiling point than the boiling point of the thio(di)silane and may include, e.g., non-volatile vehicle such as the vehicle and/or oligomeric or polymeric by-products formed by condensation of two or more silane molecules during the contacting step.

The concentrated form of the thio(di)silane may then be purified by fractional distillation to give a purified form of the thio(di)silane. The purity of the thio(di)silane and the purified thio(di)silane may be determined by reverse phase liquid chromatography or, more likely, by gas chromatography (GC) as described later. For example, the purity determined by GC may be from 60 area % to 100 area % (GC), alternatively from 70 area % to 100 area % (GC), alternatively from 80 area % to 100 area % (GC), alternatively from 90 area % to 100 area % (GC), alternatively from 93 area % to 100 area % (GC), alternatively from 95 area % to 100 area % (GC), alternatively from 97 area % to 100 area % (GC), alternatively from 99.0 area % to 100 area % (GC). Each 100 area % (GC) independently may be equal to 100 area % (GC), in which aspect the purified thio(di)silane is the thio(di)silane per se. Alternatively each 100 area % (GC) independently may be <100 area % (GC), in which aspect the purified thio(di)silane is the composition. The maximum purity of the composition having <100 area % (GC) may be 99.9999999 area % (GC) ("nine 9's" purity), alternatively 99.999999 area % (GC) ("eight 9's" purity), alternatively 99.99999 area % (GC) ("seven 9's" purity), alternatively 99.9999 area % (GC) ("six 9's" purity), alternatively 99.999 area % (GC) ("five 9's" purity), alternatively 99.99 area % (GC) ("four 9's" purity), alternatively 99.9 area % (GC), all of the thio(di)silane. It is believed that the thio(di)silane, or the composition that consists essentially of the foregoing six 9's to nine 9's purity of the thio(di)silane, may be particularly useful in making silicon materials for electronics and/or photovoltaic applications, wherein generally the higher the number of 9's purity the better the usefulness thereof in said applications.

The invention is further illustrated by, and an invention embodiment may include any combinations of features and limitations of, the non-limiting examples thereof that follow. Ambient temperature is about 23° C. unless indicated otherwise.

Differential Scanning calorimetry (DSC) Method 1: instrument and standard conditions: a known weight of a sample material was loaded into a 20 microliter (µL) high pressure DSC crucible, and the crucible was sealed using a press and loaded into a furnace of a Mettler Toledo TGA/DSC 1 instrument. The furnace was thermally equilibrated at 35° C. for 20 minutes, then ramped from 35° to 400° C. at a heating rate of 10° C. per minute, held at 400° C. for 20 minutes, cooled to ambient temperature (23° C.±1 C) at a cooling rate of 10° C. per minute, and then reheated to 400° C. at a heating rate of 10° C./minute. The crucible was removed from the furnace, allowed to cool, and the weight of the sample material remeasured to determine if the sample lost mass during the test method.

Differential Scanning calorimetry (DSC) Method 2: instrument and isothermal conditions: a known weight of a sample material was loaded into a 100 µL Netzch chrome nickel steel with gold sealing disc high pressure crucible. The loaded crucible was sealed with a torque wrench and loaded into a furnace of a Mettler Toledo TGA/DSC 1 instrument. The furnace was ramped from 35° C. to the specified temperature (e.g., 350° C.) at a heating rate of 10° C. per minute, held at the specified temperature for 60 minutes, cooled to 35° C. at a cooling rate of 10° C. per minute, and then reheated to the specified temperature at 10° C. per minute. The specified temperature may be identified as a temperature shown by DSC Method 1 to give a signal of interest in its thermal profile of a material, an investigation of which signal may be carried out using DSC Method 2 to understand what happens chemically at that signal's temperature. (E.g., if a material shows transitions at 250° C. and 350° C. in DSC Method 1, two isothermal samples of the same material may be prepared and run in DSC Method 2 to 250° C. and to 350° C., respectively.) Then the crucible was removed from the furnace and the residue was measured for weight loss. A feature of DSC Method 2 is that the crucible can be opened and the residue analyzed. The residue comprised a solid and a liquid. The liquid content of the crucible was extracted with pentane and chemically characterized by GC-FID and GC-MS. The solid remaining after extraction was dried under vacuum and characterized using Raman spectroscopy.

Raman Spectroscopy Method 1: instrument and conditions. Instrument: Raman microscope spectrometer (Kaiser Optical Systems Inc.) equipped with a 785 nm diode laser without objective lens. An opened crucible containing the remaining solid residue from DSC Method 2 (isothermal)

was sealed in an argon-filled air-tight glass vial and Raman spectra were collected using the Raman microscope spectrometer with 50 milliWatt (mW) laser power and a total 300 seconds scans at 5 cm$^{-1}$ resolution.

Gas Chromatography-Flame Ionization Detector (GC-FID) instrument and conditions: a capillary column with 30 meters length, 0.32 mm inner diameter, and containing a 0.25 μm thick stationary phase in the form of a coating on the inner surface of the capillary column, wherein the stationary phase was composed of phenyl methyl siloxane. Carrier gas was helium gas used at a flow rate of 105 mm per minute. GC instrument was an Agilent model 7890A gas chromatograph. Inlet temperature was 200° C. GC experiment temperature profile consisted of soaking (holding) at 50° C. for 2 minutes, ramping temperature up at a rate of 15° C./minute to 250° C., and then soaking (holding) at 250° C. for 10 minutes.

Gas Chromatography-Thermal Conductivity Detector (GC-TCD) instrument and conditions: a capillary column with 30 meters length, 0.32 mm inner diameter, and containing a 0.25 μm thick stationary phase in the form of a coating on the inner surface of the capillary column, wherein the stationary phase was composed of phenyl methyl siloxane. Carrier gas was helium gas used at a flow rate of 105 mm per minute. GC instrument was an Agilent model 7890A gas chromatograph. Inlet temperature was 200° C. GC experiment temperature profile consisted of soaking (holding) at 50° C. for 2 minutes, ramping temperature up at a rate of 15° C./minute to 250° C., and then soaking (holding) at 250° C. for 10 minutes.

GC-MS instrument and conditions: Sample was analyzed by electron impact ionization and chemical ionization gas chromatography-mass spectrometry (EI GC-MS and CI GC-MS). Agilent 6890 GC conditions included a DB-1 column with 30 meters (m)×0.25 millimeter (mm)×0.50 micrometer (μm) film configuration. An oven program of soaking at 50° C. for 2 minutes, ramping at 15° C./minute to 250° C., and soaking at 250° C. for 10 minutes. Helium carrier gas flowing at constant flow of at 1 mL/minute and a 50:1 split injection. Agilent 5973 MSD conditions included a MS scan range from 15 to 800 Daltons, an EI ionization and CI ionization using a custom CI gas mix of 5% NH$_3$ and 95% CH$_4$.

$^{29}$Si-NMR instrument and solvent: a Varian 400 MHz Mercury spectrometer was used. C$_6$D$_6$ was used as the solvent.

$^{13}$C-NMR instrument and solvent: a Varian 400 MHz Mercury spectrometer was used. C$_6$D$_6$ was used as the solvent.

$^1$H-NMR instrument and solvent: a Varian 400 MHz Mercury spectrometer was used. C$_6$D$_6$ was used as the solvent.

Boiling Point Test Method 1: use ACD/Labs Percepta Boiling Point Module, 2012 release, Advanced Chemistry Development, Inc., Toronto, Ontario, Canada.

Experimental technique: all chemical manipulations were performed using an inert atmosphere and Schlenk apparatus and glove box. Suitable solvent for forming a lithium hydrocarbylthiolate such as a lithium alkylthiolate is an anhydrous form of diethyl ether, dibutyl ether, 1,2-dimethoxyethane, or a mixture of any two or three thereof.

Inventive Example (IEx.) (a): synthesis of lithium 1,1-dimethylethylthiolate. To a stirred solution of 1,1-dimethylethylthiol (280 g, 3.1 mol) in anhydrous diethyl ether at −40° C. was added dropwise a 6.3 Molar solution of n-butyl lithium in hexanes, and after the addition was complete the resulting mixture was allowed to warm to room temperature to give a solution of lithium 1,1-dimethylethylthiolate.

IEx. 1: synthesis of bis(1,1-dimethylethylthio)silane, which is of formula

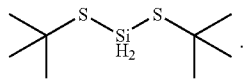

To a stirred solution of dichlorosilane (SiCl$_2$H$_2$; 156.8 g. 1.55 mol) in heptane at 40° C. was added the solution of lithium 1,1-dimethylethylthiolate of IEx. (a) (3.1 mol) to give a reaction mixture. The rate of addition of the solution of lithium 1,1-dimethylethylthiolate was controlled to keep the temperature of the reaction mixture at −40° C. After the addition was complete, the reaction mixture was stirred for 2 hours at −40° C., and then allowed to warm to room temperature. The resulting mixture was filtered through a glass frit to remove solids (e.g., LiCl), and the filtrate was fractionally distilled to give the bis(1,1-dimethylethylthio) silane (70% yield) as a clear, colorless liquid. $^1$H-NMR 1.39 ppm (singlet, 2H), 5.39 ppm (singlet, 2H). $^{13}$C-NMR: 33.92 ppm (singlet), 45.42 ppm (singlet). $^{29}$Si-NMR: −30.99 ppm (triplet). GC/MS: molecular ion (m/z=208.2) were consistent with bis(1,1-dimethylethylthio)silane.

IEx. (b): synthesis of lithium 1,2-dimethylpropylthiolate. To a stirred solution of 1,2-dimethylpropylthiol (10.0 g, 0.096 mol) dissolved in 50 g hexanes at −5° C., was added dropwise 38.4 mL of 2.5 M solution of n-butyl lithium in hexanes, and after the addition was complete, copious amounts of a white precipitate had formed, which was lithium 1,2-dimethylpropylthiolate. The resulting mixture was allowed to warm to room temperature and stirred for 1 hour. Then, the supernatant solution was decanted, and the remaining solid was washed with 10 mL of pentane and dried under reduced pressure to yield 10.08 g (0.092 mol, 95.4% yield) of lithium 1,2-dimethylpropylthiolate.

IEx. 2: synthesis of bis(1,2-dimethylpropylthio)silane, which is of formula

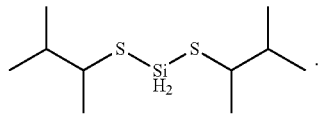

To a stirred solution of dichlorosilane (SiCl$_2$H$_2$; 3.21 g. 0.032 mol) in heptane at −20° C. was added 7.00 g (0.064 mol) of solid lithium 1,2-dimethylpropylthiolate of IEx. (b) in 1 g portions spread over 25 minutes to give a reaction mixture. After the addition was complete, the reaction mixture was stirred for 10 minutes at −20° C. and then slowly warmed to room temperature. The resulting mixture was filtered through a glass frit to remove solids (LiCl), and the low-boiling components were removed from the filtrate under reduced pressure to give 4.44 g (0.019 mol, 59.0% yield) of bis(1,2-dimethylpropylthio)silane as a clear, colorless liquid. The bis(1,2-dimethylpropylthio)silane can be further purified by distillation if desired. $^1$H-NMR: 0.88 ppm (doublet, 6H), 0.93 ppm (doublet, 6H), 1.25 ppm (doublet 6H), 1.73 ppm (multiplet, 2H), 3.00 ppm (multiplet, 2H), 5.31 ppm (singlet, 2H). $^{13}$C-NMR: 19.07 ppm, 19.51 ppm, 21.44 ppm, 21.48 ppm, 35.55 ppm, 47.03 ppm, 47.10 ppm.

$^{29}$Si-NMR: −15.93 ppm (triplet). GC/MS molecular ion (m/z=236.2) were consistent with bis(1,2-dimethylpropylthio)silane.

IEx. 3: synthesis of dichloro-bis(1,2-dimethylpropylthio)-silane, which is of formula

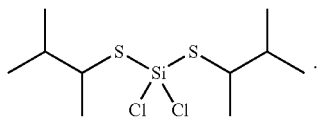

To a stirred solution of silicon tetrachloride (1.54 g, 0.009 mol) in 10 mL of pentane at 0° C. was added 2.00 g (0.018 mol) of solid lithium 1,2-dimethylpropylthiolate of IEx. (b) slowly over 40 minutes to give a reaction mixture. After the addition was complete, the reaction mixture was stirred for 1 h. The resulting mixture was filtered through a glass frit to remove solids (LiCl), and the low-boiling components were removed from the filtrate under reduced pressure to give 2.23 g of crude bis(1,2-dimethylpropylthio)-dichlorosilane (58.4% pure, 0.04 mol, 47.0% yield) as a clear, colorless liquid. The bis(1,2-dimethylpropylthio)silane can be further purified by distillation if desired. GC/MS molecular ion (m/z=304.1) was consistent with dichloro-bis(1,2-dimethylpropylthio)-silane.

IEx. 4: attempted synthesis of a composition comprising a mixture of bis(1,1-dimethylethylthio)silane and 1,1-dimethylethylthiosilane, which is of formula

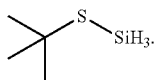

Heat neat bis(1,1-dimethylethylthio)silane in a 15 mL scintillation vial with a septum vented with a needle to 157° C. for 10 minutes so that it thermally redistributed, and cool to room temperature to give the composition comprising bis (1,1-dimethylethyl)disulfide (($CH_3$)$_3$CSSC($CH_3$)$_3$) as a clear, colorless liquid. GC/MS molecular ion (m/z=178.1) was consistent with bis(1,1-dimethylethyl)disulfide (($CH_3$)$_3$CSSC($CH_3$)$_3$).

IEx. 5: synthesis of (1,1-dimethylethylthio)disilane: 1,1-dimethylethylthiol (6.74 g; 74.7 mmol) was added to diisopropylaminodisilane (10.05 g; 62.3 mmol) at room temperature. The resulting mixture was heated at 60° C. for 2 hours, and cooled to room temperature. GC analysis showed a 99% conversion to (1,1-dimethylethylthio)disilane. The reaction mixture was fractionally distilled through a 6-inch (15 centimeter (cm)) Vigreux column to give (1,1-dimethylethylthio)disilane having 98.1% purity by GC-FID. $^1$H NMR, GC-FID, GC-MS and DSC Method 1 (standard conditions) were consistent with (1,1-dimethylethylthio)disilane.

IEx. 6: synthesis of (phentylthio)disilane: Thiophenol (5.34 g; 48.5 mmol; $C_6H_5SH$) was added to diisopropylaminodisilane (8.60 g; 53.3 mmol) at up to 40° C. The resulting mixture was heated at 70° C. for 0.5 hour to give (phenylthio)disilane. GC-FID analysis showed a 95% conversion to (phenylthio)disilane. The reaction mixture was fractionally distilled through a 6-inch (15 cm) Vigreux column to give (phenylthio)disilane having 99.2% purity by GC-FID. $^1$H NMR, GC-FID, GC-MS and DSC Method 1 (standard conditions) were consistent with (phenylthio)disilane.

IEx. 7: synthesis of (2-methylphenylthio)disilane: toluenethiol (4.27 g; 34.4 mmol) was added to diisopropylaminodisilane (6.10 g; 37.8 mmol) at up to 35° C. The resulting mixture was heated at 70° C. for 0.5 hour. GC-FID analysis showed a 96% conversion to (2-methylphenylthio)disilane. The reaction mixture was fractionally distilled through a 6-inch (15 cm) Vigreux column to give (2-methylphenylthio)disilane having 99.5% purity by GC-FID. $^1$H NMR, GC-FID, GC-MS and DSC Method 1 (standard conditions) were consistent with (2-methylphenylthio)disilane.

IEx. 8: synthesis of (t-pentylthio)silane; a solution of diisopropylaminosilane (DiPAS) in toluene containing 7.7% (w/w) DiPAS or 1.00 g (7.65 mmol) of DiPAS was loaded in a Schlenk tube. Then 2.15 g (20.6 mmol) of t-pentylthiol was added dropwise at room temperature. This reaction mixture was heated at 62° C. for 60 minutes, and fractionally distilled through a 12 inch Vigreux column under vacuum to recover a clear liquid product (0.90 g). The liquid product was analyzed by GC-FID and GC-MS and contained 41% (w/w) (t-pentylthio)silane.

IEx. 9: Synthesis of (phenylthio)silane PhSSiH$_3$ and bis(phenylthio)silane (PhS)$_2$SiH$_2$: A solution of diisopropylaminosilane (DiPAS) in toluene containing 7.7% (w/w) DiPAS or 1.03 g (7.84 mmol) of DiPAS was loaded in a Schlenk tube. Then 0.786 g (7.13 mmol) of thiophenol was added dropwise at room temperature. This reaction mixture was heated at 67° C. for 30 minutes, and evacuated at room temperature to remove low boilers. A clear liquid residue (0.50 g) was recovered as the product. The liquid product was analyzed by GC-FID and GC-MS and contained 95% (w/w) phenylthiosilane. (Bisphenylthio)silane was formed at 32% conversion from (phenylthio)silane in 3 days at room temperature.

IEx. 10: Synthesis of (2-methylphenylthio)silane 2-MePhSSiH$_3$ and bis(2-methylphenylthio)silane (2-MePhS)$_2$SiH$_2$: A solution of diisopropylaminosilane (DiPAS) in toluene containing 7.7% (w/w) DiPAS or 1.00 g (7.61 mmol) of DiPAS was loaded in a Schlenk tube. Then 1.12 g (9.02 mmol) of 2-methylthiophenol was added dropwise at room temperature. This reaction mixture was heated at 65° C. for 30 minutes, and evacuated at room temperature to remove low boilers. A clear liquid residue (1.10 g) was recovered as the product. The liquid product was analyzed by GC-FID and GC-MS and contained 95% (w/w) (2-methylphenylthio)silane. Bis(2-methylphenylthio)silane was formed at 15% conversion from (2-methylphenylthio)silane in 3 days at room temperature.

IEx. 11: Synthesis of (2,6-dimethylphenylthio)silane 2,6-Me$_2$PhSSiH$_3$ and bis(2,6-dimethylphenylthio)silane (2,6-Me$_2$PhS)$_2$SiH$_2$: A solution of diisopropylaminosilane (DiPAS) in toluene containing 7.7% (w/w) DiPAS or 1.06 g (8.07 mmol) of DiPAS was loaded in a Schlenk tube. Then 1.27 g (9.19 mmol) of 2,6-dimethylthiophenol was added dropwise at room temperature. This reaction mixture was heated at 67° C. for 30 minutes, and evacuated at room temperature to remove low boilers. A clear liquid residue (1.37 g) was recovered as the product. The liquid product was analyzed by GC-FID and GC-MS and contained 95% (w/w) (2,6-dimethylphenylthio)silane. Bis(2,6-dimethylphenylthio)silane was formed at 5% conversion from (2,6-dimethylphenylthio)silane in 31 days at room temperature.

IEx. 12: Synthesis of (benzylthio)disilane PhCH$_2$SSiH$_2$SiH$_3$:Benzylthiol (0.651 g; 5.24 mmol) was added to diisopropylaminodisilane (0.930 g; 5.76 mmol) at room temperature. The resulting mixture was heated at 66° C. for 0.5 hour. GC-FID analysis showed a 99% conversion to (benzylthio)disilane. The reaction mixture was evacuated at room temperature to remove low boilers. A clear liquid residue (0.50 g) was recovered as the product. The product contained 97% (benzylthio)disilane by GC-FID. $^1$H NMR, GC-FID and GC-MS were consistent with (benzylthio) disilane.

IEx. A: preparation of a silicon nitride film (prophetic) using bis(1,1-dimethylethylthio)silane and ammonia (NH$_3$) with LPCVD: using a LPCVD reactor and a bubbler containing the bis(1,1-dimethylethylthio)silane of IEx. 1 and in fluid communication with the LPCVD reactor. Feed ammonia diluted in helium to the LPCVD reactor. Heat the bubbler containing bis(1,1-dimethylethylthio)silane to 70° C. to increase vapor pressure thereof. Then flow He carrier gas through the bubbler to carry vapor of bis(1,1-dimethylethylthio)silane into the LPCVD reactor, wherein the LPCVD reactor contains vaporous ammonia and a plurality of vertically oriented and spaced apart silicon wafers heated to from 60° to 800° C. so a conformal silicon nitride film is formed on the wafers.

IEx. B: preparation of a silicon nitride film (prophetic): using bis(1,1-dimethylethylthio)silane and ammonia (NH$_3$) with ALD: using an ALD reactor and a bubbler containing the bis(1,2-dimethylpropylthio)silane of IEx. 2 and in fluid communication with the ALD reactor. First feed the bis(1, 1-dimethylethylthio)silane in helium to the ALD reactor, then stop the first feed and start a second feed of ammonia diluted in helium to the ALD reactor. Heat the bubbler containing bis(1,1-dimethylethylthio)silane to 70° C. to increase vapor pressure thereof. The ALD reactor contains a plurality of vertically oriented and spaced apart silicon wafers heated to from 60° to 600° C. Alternate the first and second feeds so that a conformal film containing silicon nitride is formed on the wafers.

The below claims are incorporated by reference here, and the terms "claim" and "claims" are replaced by the term "aspect" or "aspects," respectively. Embodiments of the invention also include these resulting numbered aspects.

What is claimed is:

1. A thiodisilane of formula (I-a):

$$(R^{1a}R^{1b}R^{1c}CS)_s(Si\text{—}Si)H_h \qquad \text{(I-a)},$$

wherein:
subscript s is an integer from 1 to 6;
subscript h is an integer from 0 to 5;
with the proviso that sum s+h=6
each H, when present in formula (I), is independently bonded to the same or different one of the silicon atoms in formula (I);
wherein $R^{1a}$, $R^{1b}$, and $R^{1c}$ are defined by limitation (a), (b), or (c):

(a) at least one $R^{1a}$ independently is (C$_1$-C$_{20}$)alkyl or phenyl and each of any remaining $R^{1a}$, $R^{1b}$, and $R^{1c}$ independently is H or (C$_1$-C$_{20}$)hydrocarbyl; or (b) at least one $R^{1a}R^{1b}R^{1c}C$ group is independently a (C$_6$-C$_{20}$)aryl that is unsubstituted or substituted with substituent SUB and each of $R^{1a}$, $R^{1b}$, and $R^{1c}$ of remaining $R^{1a}R^{1b}R^{1c}C$ groups independently is H or (C$_1$-C$_{20}$)hydrocarbyl, with the proviso that when subscript s is 2, the remaining $R^{1a}R^{1b}R^{1c}C$ group is a (C$_6$-C$_{20}$)aryl that is substituted with substituent SUB, or $R^{1a}$, $R^{1b}$, and $R^{1c}$ of the remaining $R^{1a}R^{1b}R^{1c}C$ group independently is H or (C$_1$-C$_{20}$)hydrocarbyl; or (c) any two of $R^{1a}$, $R^{1b}$, and $R^{1c}$ in the same or different $R^{1a}R^{1b}R^{1c}C$ group are bonded together to form a divalent group, —$R^{11}$—, wherein —$R^{11}$— is a CH$_2$ or a (C$_3$-C$_{20}$)hydrocarbylene and each of any remaining $R^{1a}$, $R^{1b}$, and $R^{1c}$ independently is H or (C$_1$-C$_{20}$) hydrocarbyl;

each hydrocarbyl and hydrocarbylene independently is unsubstituted or substituted with from 1 to 5 substituents SUB; and each SUB independently is unsubstituted (C$_1$-C$_6$)alkyl, unsubstituted (C$_3$-C$_6$)cycloalkyl, unsubstituted (C$_2$-C$_6$) alkenyl, unsubstituted (C$_2$-C$_6$)alkynyl, unsubstituted (C$_6$-C$_7$)aryl, fluoro, chloro, or bromo.

2. The thiodisilane of claim 1:
wherein subscript s is 4; subscript h is 2; and wherein X, $R^{1a}$, $R^{1b}$, $R^{1c}$, and $R^2$ are as defined above for formula (I-a); or
wherein subscript s is an integer from 1 to 4; subscript h is 2 to 5; with the proviso that sum s+h=6; and wherein $R^{1a}$, $R^{1b}$ and $R^{1c}$ are as defined above for formula (I-a).

3. The thiodisilane of claim 1, wherein subscript s is 1 or 2.

4. The thiodisilane of claim 1 wherein each (C$_1$-C$_{20}$) hydrocarbyl independently is an unsubstituted alkyl, an unsubstituted aryl, or an alkyl-substituted aryl.

5. The thiodisilane of claim 1 wherein subscript s 1; subscript h is 5; and each (C$_1$-C$_{20}$)hydrocarbyl independently is an unsubstituted (C$_1$-C$_6$)alkyl, unsubstituted aryl, or a (C$_1$-C$_3$)alkyl-substituted (C$_6$)aryl.

6. The thiodisilane of claim 1 selected from: (1,1-dimethylethylthio)disilane; bis(1,1-dimethylethylthio)disilane; (phenylthio)disilane; (t-pentylthio)disilane; bis(t-pentylthio) disilane; (benzylthio)disilane; bis(benzylthio)disilane; (2-methylphenylthio)disilane; bis(2-methylphenylthio)disilane; (2,6-dimethylphenylthio)disilane; bis(2,6-dimethylphenylthio)disilane; 1,1-bis(phenylthio)disilane; (1,2-dimethylpropylthio)disilane; and bis(1,2-dimethylpropylthio) disilane.

* * * * *